(12) United States Patent
Gordon et al.

(10) Patent No.: US 6,218,671 B1
(45) Date of Patent: Apr. 17, 2001

(54) ON-LINE DYNAMIC CORRECTIONS ADJUSTMENT METHOD

(75) Inventors: Michael Gordon, Lincolndale; Steven Golladay, Hopewell Junction; Chris Robinson, Hyde Park; James Rockrohr, Hopewell Junction, all of NY (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/144,275

(22) Filed: Aug. 31, 1998

(51) Int. Cl.[7] ............................................... H01J 37/244
(52) U.S. Cl. ............................................ 250/397; 250/398
(58) Field of Search ................................... 250/397, 398, 250/491.1, 492.2, 492.22

(56) References Cited

U.S. PATENT DOCUMENTS

| | | | |
|---|---|---|---|
| 4,370,554 | * 1/1983 | Bohlen et al. | 250/397 |
| 5,012,105 | * 4/1991 | Ando et al. | 250/398 |
| 5,160,845 | * 11/1992 | Stumbo et al. | 250/398 |
| 5,650,629 | * 7/1997 | Levi | 250/397 |
| 5,811,805 | * 9/1998 | Osakabe et al. | 250/397 |
| 5,932,880 | * 8/1999 | Koguchi et al. | 250/397 |

* cited by examiner

Primary Examiner—Kiet T. Nguyen
(74) Attorney, Agent, or Firm—McguireWoods, LLP

(57) ABSTRACT

A small pinhole aperture and a scintillator are used to observe resolution in a charged particle beam system which is particularly applicable to electron beam projection devices in which the beam is several orders of magnitude larger than the desired resolution and minimum feature size to be produced. A pattern having a feature which is of comparable size to the desired resolution to be observed is scanned across the aperture in two dimensions and a synchronized display of measured light output from the scintillator allows real-time observation of the effects of correction adjustments on the resolution of the system. In this manner, a rough adjustment to near optimum corrections can be obtained over the deflection field in a much reduced number of iterations.

11 Claims, 3 Drawing Sheets

ON-LINE DYNAMIC CORRECTIONS ADJUSTMENT METHOD

CROSS-REFERENCE TO RELATED APPLICATIONS

This application is related to U.S. patent application Ser. No. 09/143,999, filed on even date herewith, which is hereby fully incorporated by reference as if fully set forth herein and accorded a filing date of Oct. 1, 1998.

BACKGROUND OF THE INVENTION

1. Field of the Invention

The present invention generally relates to charged particle beam systems and, more particularly, to resolution measurement and adjustment in charged particle beam lithography and microscopy tools.

2. Description of the Prior Art

Numerous techniques utilizing charged particle beams are known and in widespread use for manufacture of integrated circuit devices, in particular. For example, charged particle beams are used for implantation of impurities, inspection (e.g. with scanning electron microscopes) of structures for process evaluation and development and for lithographic patterning of substrates and layers deposited thereon. Essentially, lithography processes define potentially very minute areas and shapes on a surface through selective exposure and removal of portions of a layer of resist to expose areas of the surface for further processing by, for example, etching, implantation and/or deposition. For both lithographic patterning and inspection, electron beams (e-beams) are the charged particle beam of choice since the low mass of electrons allows the beam to be manipulated with high positional accuracy and resolution with reduced energy relative to other particles.

There is a strong incentive in the manufacture of integrated circuits to increase integration density to the greatest possible degree consistent with acceptable manufacturing yields. Device arrays of increased density provide increased performance since signal propagation time is reduced and noise immunity is increased with reduced connection length and capacitance. Further, increased device density on a chip allows greater chip functionality as well as greater numbers of devices to be manufactured on a chip of a given area; providing increased economy of manufacture if manufacturing yields can be maintained.

Whether for lithographic patterning or inspection, the resolution of the charged particle beam is of paramount importance as integration density is increased in order to expose or discriminate the minimum feature size specified by the design rules for the device. So-called probe-forming systems have been developed to provide a resolution of a small fraction of a micron.

Probe forming systems produce a single minute spot for exposure which must then be deflected through each exposure element of a desired pattern. While deflection can be done at high speed, decreasing feature size multiplies the number of spot exposures which must be made for each integrated circuit device of a given overall area and, thus, increasing integration density reduces throughput below generally acceptable levels to support significant production volume of a single design.

Alternatively, e-beam projection systems (as distinct from probe forming systems) project images of reticle sections or sub-fields which may contain many millions of image elements for a single exposure and throughput is relatively high even at very small feature size and high integration density. The image at the target (wafer) can generally be reduced substantially in size relative to the size of the patterned reticle, generally by a factor of four or five. The beams are thus correspondingly large in cross-section relative to the minimum feature size (whereas the minimum feature size is generally comparable in size to the beam size made by a probe-forming system) and characteristically includes patterned features.

Resolution is generally assessed in regard to probe-forming e-beam systems by scanning the beam across a knife-edge structure provided in the tool for that purpose. Typically, the beam is scanned across the knife edge structure and the rise time of the differentiated back-scatter or transmitted current signal is measured. Dynamic correction elements (e.g. focus coil, stigmator coils, and the like) can be adjusted to optimize resolution. Final adjustments are then made by analysis of the effects of the dynamic corrections on images formed in a resist on a test target (e.g. wafer). It should be appreciated that resolution must be assured over a wide scanning field and portions of the entire resist surface of the wafer are generally employed for such a test. By the same token, correct adjustments over the entire field may not be verifiable in a single test with a single target. Therefore, the adjustment procedure may be protracted and expensive.

However, the knife-edge resolution evaluation technique cannot be extended to e-beam projection systems having a large beam. It can be readily appreciated from the fact that in e-beam projection systems the beam cross-sectional size is on the order of 250 $\mu$m (as compared with a resolution of less than 0.1 $\mu$m) that extension of the knife-edge technique to such beams would require a knife-edge structure which was smooth, straight and aligned to much less than 0.1 $\mu$m over a length of more than 250 $\mu$m. Such accuracy would be extremely expensive and may not be possible while, even if available, such a structure would be subject to damage or compromise with each use and in the absence of any convenient or even practical technique to detect such damage or compromise.

SUMMARY OF THE INVENTION

It is therefore an object of the present invention to provide a technique and apparatus for evaluation of resolution of charged particle beam projection systems.

It is another object of the invention to provide a resolution evaluation technique and apparatus in charged particle beam systems which does not rely on a high-precision knife-edge structure.

It is a further object of the invention to provide a resolution evaluation and optimization procedure and apparatus capable of optimization of resolution over the full field of the tool in a single procedure.

In order to accomplish these and other objects of the invention, an apparatus is provided for observing resolution in a charged particle beam system by imaging a reticle pattern on a target plane, including a reticle having a feature of a size comparable to desired resolution of the charged particle beam system, a small aperture located in a target plane of the charged particle beam system, an arrangement, such as an auxiliary coil, for scanning an image of the feature across the aperture, and a detector, such as a scintillator located below the aperture and a photodetector for measuring light output of the scintillator, for measuring charged particle flux through the aperture as the image of the feature is scanned across the aperture. A synchronized display of the measurement of light output of the scintillator allows real-time observation of effects of adjustments on resolution.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
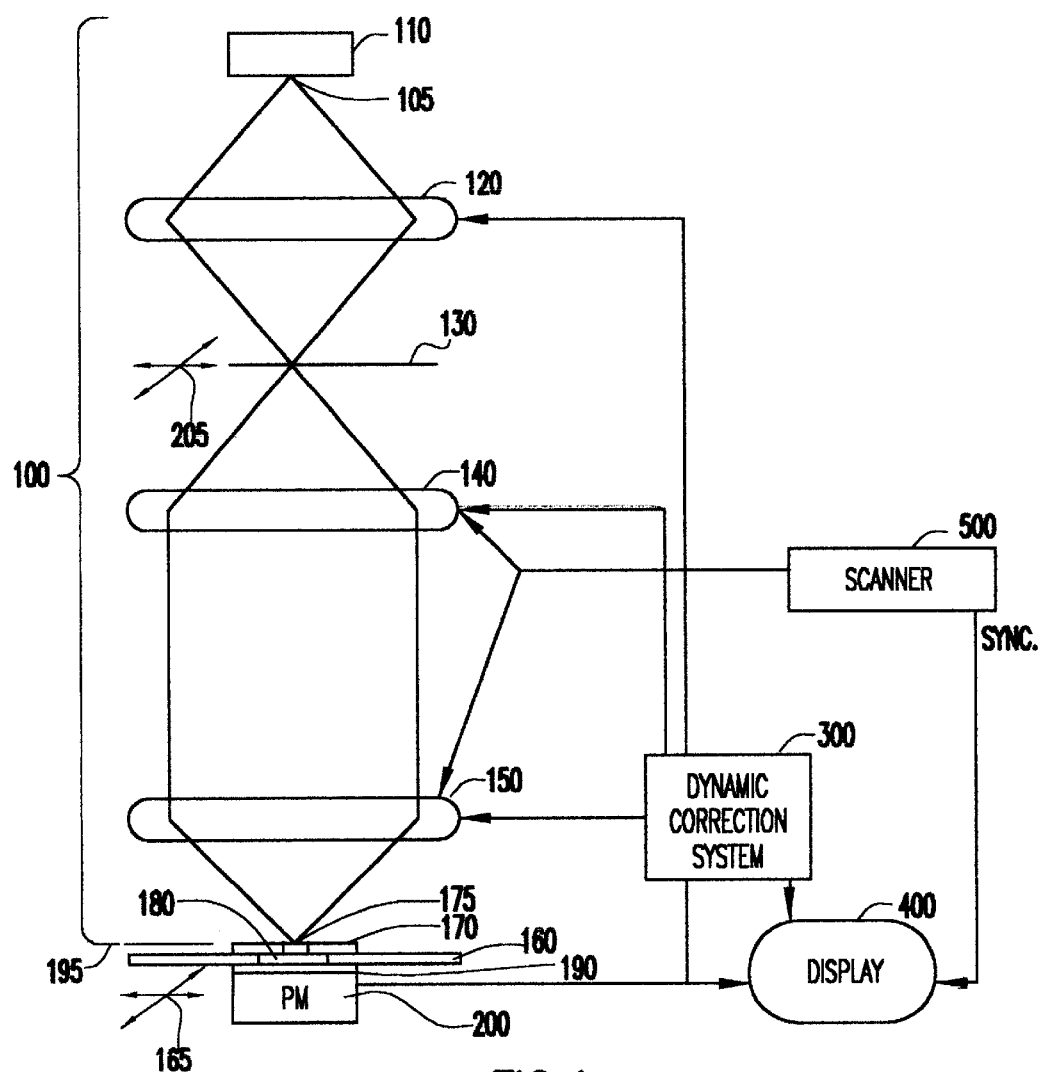
FIG. 1 is a schematic diagram of a generalized e-beam projection system and including the invention.

Referring now to the drawings, and more particularly to FIG. 1, there is shown, in generalized and schematic form a representative form of an e-beam projection system in combination with a schematic representation of the invention in combination therewith. It should be understood that the details of the form of the e-beam projection system, itself, is not particularly important to the practice of the invention and the illustration of FIG. 1 is provided to facilitate an understanding of the principles and operation of the invention.

By the same token, while the invention will be described in connection with the preferred application to e-beam projection lithography tools, the illustration of FIG. 1 should be considered as being generic to systems directed to other functionalities such as electron microscopy systems and systems using other species of charged particles such as ion beams. While some of the illustrated features of the e-beam projection column 100 (above the target plane 195) may be well-known, no portion of FIG. 1 is admitted to be prior art in regard to the present invention, particularly since a schematic representation of the invention is included therein.

The generalized form of the e-beam projection system of FIG. 1 includes an electron source 110, beam defining aperture 105, magnetic lens systems 120, 140, 150 which may include various types of correction elements, such as focus coils and stigmators, and deflectors. Alternatively, such correction or deflection elements may be placed at any location along the column 100 to optimize their intended function in combination with other electron optical elements. Electron beam projection systems also include a reticle 130 of either the scattering or stencil type. The reticle is patterned with a plurality of sub-field patterns and mounted on a translational stage schematically indicated by arrows 205. The beam defining aperture 105 is imaged to reticle 130 and slightly overfills the active area of a reticle sub-field. The active sub-field pattern is imaged and projected to the target (wafer) by lenses 140 and 150.

Deflection of the beam may occur above or below the reticle 130, or both. The lenses 120, 140 and 150, shown in FIG. 1, may be of the variable axis type, so that the lens axis shifts in synchronism with beam deflection, thereby reducing off-axis aberrations such as field curvature, astigmatism and the like, as the beam is deflected.

Specifically, the invention provides an apparatus and methodology for assessing and dynamically controlling resolution of a charged particle beam system by providing a plate 170 having a "pin-hole" aperture 175 of small size therein and located at the target plane of the system. The pin-hole should be as small as conveniently possible (and preferably of a construction as disclosed in the above-incorporated, concurrently filed application) but need not closely approach the dimensions of minimum feature size of an integrated circuit of current design. For example a 2.0 $\mu$m diameter aperture (e.g. about 1% of the transverse dimension of the beam but more than an order of magnitude greater than the minimum feature size) can be readily and accurately produced and is sufficient for practice of the invention.

An arrangement for detecting charged particle flux through the aperture, preferably comprising scintillator 180 which emits light when struck by the electrons traversing the pinhole, is placed directly below pinhole aperture 175. Sensitive current detectors could be used but have lower gain and larger noise compared to a scintillator and photomultiplier. The surface of the scintillator that the beam hits is coated with a suitable material and is electrically grounded to prevent charging from the beam current. The scintillator must be of sufficient thickness to stop the beam so that the largest light output possible will be produced. Suitable scintillator materials are yttrium aluminum garnet (YAG) single crystal and yttrium aluminum pervoskite (YAP) single crystal, but those skilled in the art will recognize that other scintillating materials could be used, as well. The pinhole aperture 175 and plate 170 as well as scintillator 180 are mounted onto the translational stage 160.

A vacuum window 190 is placed under the scintillator and is used as the air/vacuum interface. A photomultiplier 200 is arranged below the vacuum window to receive light from the scintillator, The details of the photomultiplier are not particularly important to the practice of the invention but it should be sufficiently sensitive and matched in wavelength response to the scintillator to produce an output signal with reasonable amplitude and low noise.

Figure 2:
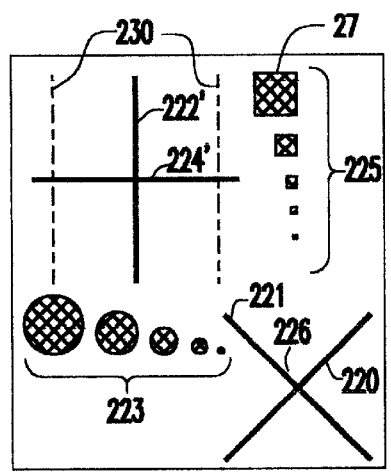
FIG. 2 is a diagram of a reticle feature usable in accordance with the principles of the invention.

Referring now to FIG. 2, a simplified reticle sub-field pattern 210 usable in the practice of the invention is shown. The pattern shown includes types of features which are preferred for practice of the invention but it should be understood that many more similar features could and preferably would be included in a reticle sub-field and the depiction of FIG. 2 is thus much simplified in comparison therewith in the interest of clarity.

It should also be understood that the feature proportions and spacings depicted in FIG. 2 are also chosen to convey an understanding of the invention and do not reflect actual feature proportions and spacings in the reticle pattern, as will be understood by those skilled in the art. The features shown in FIG. 2 could be located at several areas within a sub-field. For reference, the approximate preferred dimension of a sub-field is one millimeter and the lateral extent of the pattern shown in FIG. 2 is about 25 $\mu$m. It is considered advantageous to provide the pattern at the center and four corners of a sub-field.

Specifically, the features of the reticle sub-field pattern are preferably of a size near the resolution of the tool and spaced apart by at least the diameter of pin-hole aperture 175. A series of features having widths smaller and larger than the resolution of the tool are included in the reticle sub-field pattern. These include rectangular patterns with horizontal (224'), vertical (222) and 45° (220, 221) edge orientations with respect to translation 165 of the wafer stage or reticle stage 205. Circular (223) and square (225) features of varying dimension are preferably included in the sub-field, as well. It should be understood that this pattern contains features which have been found convenient for use in accordance with the invention and are thus preferred. However, the same or similar features could be provided in other patterns and the overall pattern is not critical to the practice of the invention.

Figure 3:
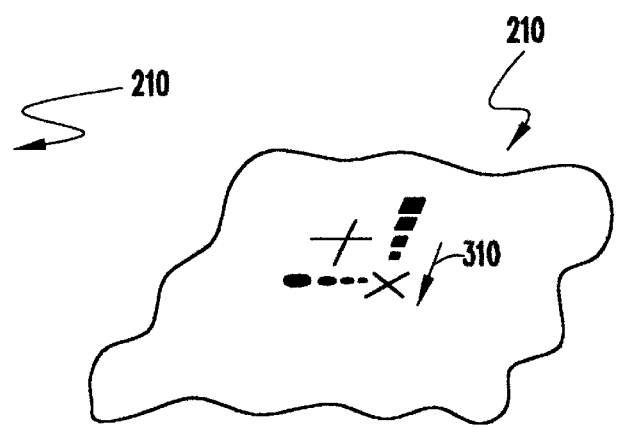
FIG. 3 is an isometric view of the target of the e-beam system of FIG. 1 and illustrates operation of the invention utilizing the reticle pattern of FIG. 2, FIGS. 4A, 4B, 4C and 4D illustrate resolution measurements utilizing the invention.

The pattern such as that of FIG. 2 is scanned relative to the pinhole aperture 175 as schematically illustrated at 310 of FIG. 3. Of course, whether the scanning is accomplished by movement of the pinhole aperture 175 or scanning the image of FIG. 2 over a stationary aperture or a combination of the two is irrelevant to the principles of the invention. However, to achieve high data acquisition rates, it is considered preferable to scan the image either electrostatically or magnetically across the pinhole aperture. Auxiliary deflection yokes or deflection plates could be used for this purpose. Alternatively, an additional current could be superimposed on the excitation current of a deflection yoke for this purpose.

Figure 4:
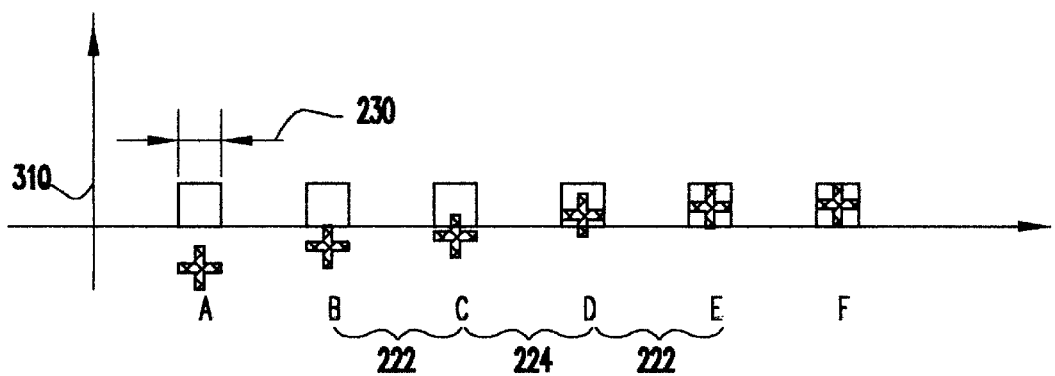
Figure 4A:
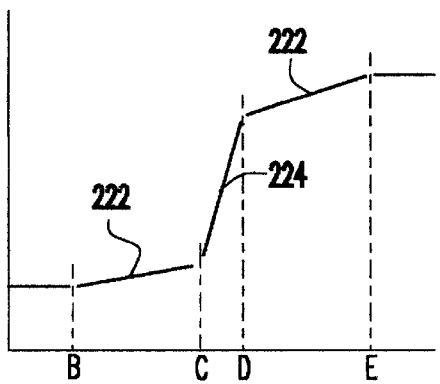

To facilitate an understanding of the invention, FIG. 4A shows a graph of illumination of scintillator 180 by pattern features 224' as a function of time during which the feature is scanned across aperture 175. The depiction is similar to the trace which could be produced on an oscilloscope synchronized with scanner 500 as schematically illustrated in FIG. 1. However, in the following discussion it should be recognized that such 1-dimensional scans are very difficult to use on a real-time basis.

Figure 5A:
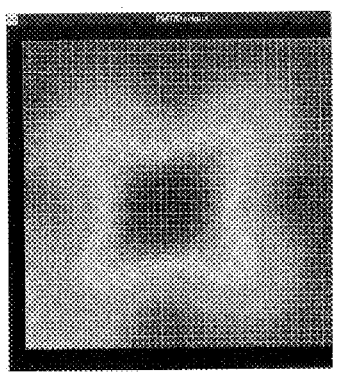
FIGS. 5A, 5B and 5C shows image recorded during resolution measurement and adjustment utilizing the invention.
Figure 5B:
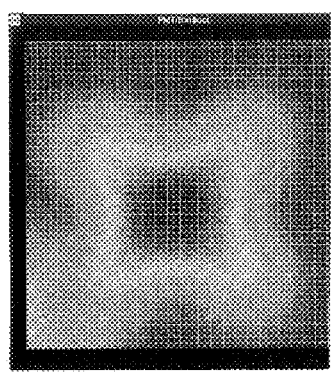
Figure 5C:
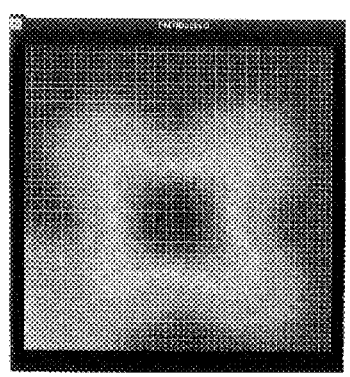

It should be recalled that the desired resolution of the tool is 0.1 $\mu$m or less and a practical pinhole aperture diameter is about 2 $\mu$m. Accordingly, it is difficult to actually resolve the individual features with such a large dimensional mismatch. Additionally, astigmatism is a focus difference between horizontal and vertical lines and a two-dimensional image, as will be discussed below in connection with FIGS. 5A–5C, is much preferred for the practice of the invention. It is considered desirable to provide such a two-dimensional display as a convenience for real-time adjustment and/or calibration of the e-beam tool but a display is not necessary to the practice of the invention in accordance with its basic principles.

For a one- or two-dimensional scan, the reticle sub-field 210 can be positioned so that the feature of interest is centered with respect to the pin-hole aperture 175. The scan amplitude is generally adjusted so that the feature is fully scanned across the entire pinhole aperture 175. Referring to FIG. 2, the dashed lines 230 schematically represent the width of the pin-hole aperture 175.

Figure 4B:
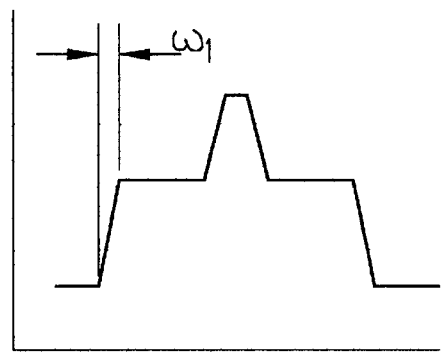

A one-dimensional scan of feature 222', 224' in the Y-direction 310, over the dimension of the pinhole aperture would encompass feature 222' as well. The illumination of the scintillator 180 and photomultiplier 200 will begin and end as edges of features 222' of pattern 210 cross respective edges of aperture 175, as shown in FIG. 4A. The differentiated one-dimensional line scan is shown in FIG. 4B. It will also be appreciated that the intersection of edges of features 224' and 222' of pattern 210 with aperture 175 (depicted as gaps in FIGS. 4A and 4C but which, of course will be connected as curves of varying extent) will generate distinct rise and fall times in the differentiated line scan (e.g. $w_1$ of FIG. 4B), for a given scan speed. If the resolution is less than optimal, the differentiated rise and fall times will become substantially less distinct (depicted by curvature at the junctions of line segments in FIGS. 4B and 4D).

Figure 4C:
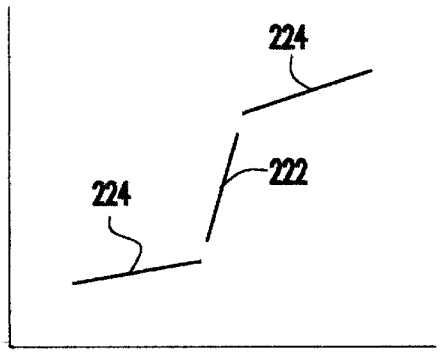
Figure 4D:
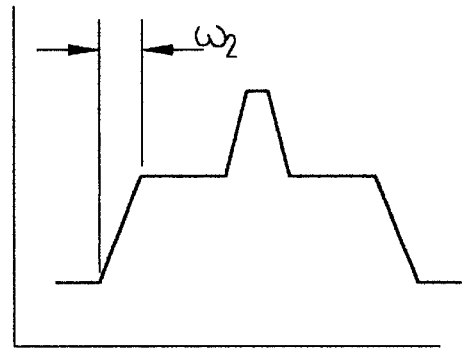

A one-dimensional scan of feature 222 in the X-direction orthogonal to 310 over the dimension of the pin-hole aperture would encompass feature 224, as well, as shown in FIG. 4C. The differentiated line scan is shown in FIG. 4D. If astigmatism exists in the beam, the rise time $w_2$ of FIG. 4D will differ from that shown in FIG. 4B.

As indicated above, the features, themselves, are very difficult to resolve given the mismatch between the sizes of the features and the pinhole and the above discussion of FIGS. 4A–4D for a single scan of a feature across the pinhole are much idealized in the interest of conveying an understanding of the principles of the invention. This is particularly true if the system is not initially adjusted to near-optimal performance as is the case to which the invention is particularly applicable. The above discussion principally points out that the information of interest is contained in the output of scintillator 180 and can be discerned in the aggregate of multiple two-dimensional scans, as will now be discussed.

A display 400 is synchronized with scanner 500 so that real-time two-dimensional images of the photomultiplier signal can be viewed as the image of the reticle sub-field is scanned over the pinhole aperture. It will be recognized by those skilled in the art that one-dimensional histograms (projections) can be obtained easily from two-dimensional data or a one-dimensional plot at any value of the scan in the orthogonal axis and could be viewed in real-time.

Corrective electron optics, including but not limited to stigmator coils, dynamic focus coils and the like can be adjusted and the effect observed in real time by viewing the display 400. With the reticle 130 moved out of the path of the beam by translational mechanism 205, the image of the beam-defining aperture 105 can be viewed on the pinhole aperture 175. An illumination stigmator (which may be distributed multiple coils) can then be energized to assure that the beam is square (or any other shape to correspond to the sub-field geometry). Similarly with the sub-field reticle of the type shown in FIG. 2 in place, the asymmetry in size between the vertical (222) and horizontal (224) lines or rectangularity in the squares 225 as viewed on the display 400 can be changed and corrected by adjusting other stigmator coils in the column. Once symmetry has been established, the focus can be optimized by viewing the clarity of the two-dimension (or one-dimensional) images.

As an example, FIGS. 5A–5C show a progression of stored bitmap images of the two diagonal lines 220 and 221 of the reticle sub-field shown in FIG. 2 as a function of a stigmator adjustment. In FIGS. 5A and 5C, asymmetry (astigmatism) between focus of diagonal lines causes the image to exhibit asymmetry in overall shape in the manner of a parallelogram with the acute angles reversed between FIG. 5A and FIG. 5C for different, non-optimal stigmator excitation. FIG. 5B, which resembles a square, corresponds to a near-optimal adjustment. For such real-time adjustment, color images are preferred with color differences corresponding to a plurality of thresholds in a histogram of the output of scintillator 180 and photomultiplier 200 since such multiple thresholds provide a more sensitive as well as easily perceptible image reflecting an increased amount of information to the operator. However, monochrome images such as those of FIGS. 5A–5C are completely adequate to the practice of the invention.

The electron optical corrections that need to be applied as a function of deflection can also be determined using the apparatus described above. The deflection of the type described in U.S. Pat. No. 5,635,719, hereby fully incorporated by reference, is planar and is both demagnified and reversed in sign/direction between the reticle and the wafer. The reticle sub-field of interest can be placed under the deflected beam by translating the reticle, in synchronism with the deflected beam, by moving stage 160. In that way, the correction as a function of deflection can be established.

The pinhole aperture technique described above thus allows for a rough setup adjustment of the corrections of interest as a function of deflection to be done in real-time and possibly automated, if desired. Thus, the invention provides a technique which reduces the number of iterations required to optimize the resolution of the electron beam. Fine adjustment may thereafter be done by exposing a sub-field on a wafer and varying the correction elements of interest. Fine examination of the images formed in resist after development can then be used to determine optimum settings.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. Apparatus for observing resolution in a charged particle beam system for imaging a reticle pattern on a target plane, said apparatus including a reticle having a feature of a size comparable to desired resolution of said charged particle beam system, a small aperture located in a target plane of said charged particle beam system, means for scanning an image of said feature across said aperture, and means for measuring charged particle flux through said small aperture as said image of said feature is scanned across said aperture.

2. Apparatus as recited in claim 1, wherein said means for measuring charged particle flux includes a scintillator located below said aperture, and means for measuring light output from said scintillator.

3. Apparatus as recited in claim 2, further including a display responsive to an output of said means for measuring light output from said scintillator.

4. Apparatus as recited in claim 3, wherein said display is synchronized with said means for scanning.

5. Apparatus as recited in claim 2, wherein said charged particle beam system further includes deflection means for imaging said feature at a plurality of locations in said target plane, said apparatus further including translation means for locating said small aperture and said scintillator at locations in said target plane corresponding to respective ones of said plurality of locations.

6. Apparatus as recited in claim 5, wherein said charged particle beam system further includes means for adjusting correction of said image of said feature, said apparatus further including means for storing adjustment values for corrections at locations in said target plane corresponding to respective ones of said plurality of locations.

7. Apparatus as recited in claim 1, wherein said scintillator includes a yttrium aluminum garnet (YAG) material.

8. Apparatus as recited in claim 1, wherein said scintillator includes a yttrium aluminum perovskite (YAP) material.

9. Apparatus as recited in claim 1, wherein said means for scanning an image includes an auxiliary deflection coil.

10. Apparatus as recited in claim 1, wherein said means for scanning an image includes an auxiliary deflection yoke.

11. Apparatus as recited in claim 1, wherein said means for scanning an image includes means for superimposing a scanning current on an excitation current of a deflector of said charged particle beam system.

* * * * *